US007417245B2

(12) United States Patent
Happ et al.

(10) Patent No.: US 7,417,245 B2
(45) Date of Patent: Aug. 26, 2008

(54) PHASE CHANGE MEMORY HAVING MULTILAYER THERMAL INSULATION

(75) Inventors: Thomas Happ, Tarrytown, NY (US); Jan Boris Philipp, Peekskill, NY (US)

(73) Assignee: Infineon Technologies AG, Munich (DE)

( * ) Notice: Subject to any disclaimer, the term of this patent is extended or adjusted under 35 U.S.C. 154(b) by 38 days.

(21) Appl. No.: 11/265,372

(22) Filed: Nov. 2, 2005

(65) Prior Publication Data
US 2007/0096162 A1 May 3, 2007

(51) Int. Cl.
*H01L 29/02* (2006.01)
(52) U.S. Cl. ............................................... 257/2; 257/4
(58) Field of Classification Search ................. 257/2–5; 438/253–254, 396
See application file for complete search history.

(56) References Cited

U.S. PATENT DOCUMENTS

| | | | |
|---|---|---|---|
| 5,933,365 A | 8/1999 | Klersy et al. | |
| 6,908,812 B2 | 6/2005 | Lowrey | |
| 2001/0002046 A1* | 5/2001 | Reinberg et al. | 257/3 |
| 2003/0151041 A1* | 8/2003 | Chiang | 257/3 |
| 2005/0227496 A1 | 10/2005 | Park et al. | |
| 2006/0091476 A1* | 5/2006 | Pinnow et al. | 257/379 |
| 2006/0175596 A1* | 8/2006 | Happ et al. | 257/2 |
| 2006/0175597 A1* | 8/2006 | Happ | 257/2 |
| 2006/0175599 A1* | 8/2006 | Happ | 257/4 |

FOREIGN PATENT DOCUMENTS

| | | |
|---|---|---|
| EP | WO 2006/084856 | 8/2006 |
| EP | WO 2006/084857 | 8/2006 |
| KR | 2005-99589 | 10/2005 |

OTHER PUBLICATIONS

S.L. Cho et al., "Highly Scalable On-axis Confined Cell Structure for High Density PRAM beyond 256Mb", VLSI 2005.
V. Giraud et al., "Thermal Characterization and Analysis of Phase Change Random Access Memory", JAP 98, 013520, 2005.
H. Horii et al., "A Novel Cell Technology Using N-Doped GeSbTe Films for Phase Change RAM", VLSI, 2003.
Y.N. Hwang et al., "Full Integration and Reliability Evaluation of Phase-Change RAM based on 0.24μm-CMOS Technologies", VLSI, 2003.
S. Lai et al., "OUM—A 180 nm Nonvolatile Memory Cell Element Technology for Stand Alone and Embedded Applications", IEDM 2001.
F. Pellizer et al., "Novel uTrench Phase Change Memory Cell for Embedded and Stand Alone Non-Volatile Memory Applications", VLSI 2004.
E.K. Kim et al., "Thermal Boundary Resistance at Ge2Sb2Te5 'ZnS-:SiO2 Interface", APL 76, 3864, 2000.
European Search Result dated Mar. 5, 2007.

\* cited by examiner

*Primary Examiner*—Jerome Jackson
*Assistant Examiner*—Jami M Valentine
(74) *Attorney, Agent, or Firm*—Dicke, Billig & Czaja, PLLC

(57) ABSTRACT

A memory cell includes a first electrode, a second electrode, phase-change material contacting the first electrode and the second electrode, multilayer thermal insulation contacting the phase-change material, and dielectric material contacting the multilayer thermal insulation. The multilayer thermal insulation may include at least an electrically isolating layer and an electrically conducting layer.

26 Claims, 14 Drawing Sheets

PHASE CHANGE MEMORY HAVING MULTILAYER THERMAL INSULATION

BACKGROUND

Phase-change memories include phase-change materials that exhibit at least two different states. Phase-change material may be used in memory cells to store bits of data. The states of phase-change material may be referenced to as amorphous and crystalline states. The states may be distinguished because the amorphous state generally exhibits higher resistivity than does the crystalline state. Generally, the amorphous state involves a more disordered atomic structure, while the crystalline state is an ordered lattice. Some phase-change materials exhibit two crystalline states, e.g. a face-centered cubic (FCC) state and a hexagonal closest packing (HCP) state. These two crystalline states have different resistivities and may be used to store bits of data. In the following description, the amorphous state generally refers to the state having the higher resistivity, and the crystalline state generally refers to the state having the lower resistivity.

Phase change in the phase-change materials may be induced reversibly. In this way, the memory may change from the amorphous state to the crystalline state, and from the crystalline state to the amorphous state, in response to temperature changes. The temperature changes to the phase-change material may be achieved in a variety of ways. For example, a laser can be directed to the phase-change material, current may be driven through the phase-change material, or current can be fed through a resistive heater adjacent the phase-change material. With any of these methods, controllable heating of the phase-change material causes controllable phase change within the phase-change material.

When a phase-change memory comprises a memory array having a plurality of memory cells that are made of phase-change material, the memory may be programmed to store data utilizing the memory states of the phase-change material. One way to read and write data in such a phase-change memory device is to control a current and/or a voltage pulse that is applied to the phase-change material. The level of current and voltage generally corresponds to the temperature induced within the phase-change material in each memory cell.

SUMMARY

One embodiment of the present invention provides a memory cell. The memory cell includes a first electrode, a second electrode, phase-change material contacting the first electrode and the second electrode, multilayer thermal insulation contacting the phase-change material, and dielectric material contacting the multilayer thermal insulation.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

Figure 1:
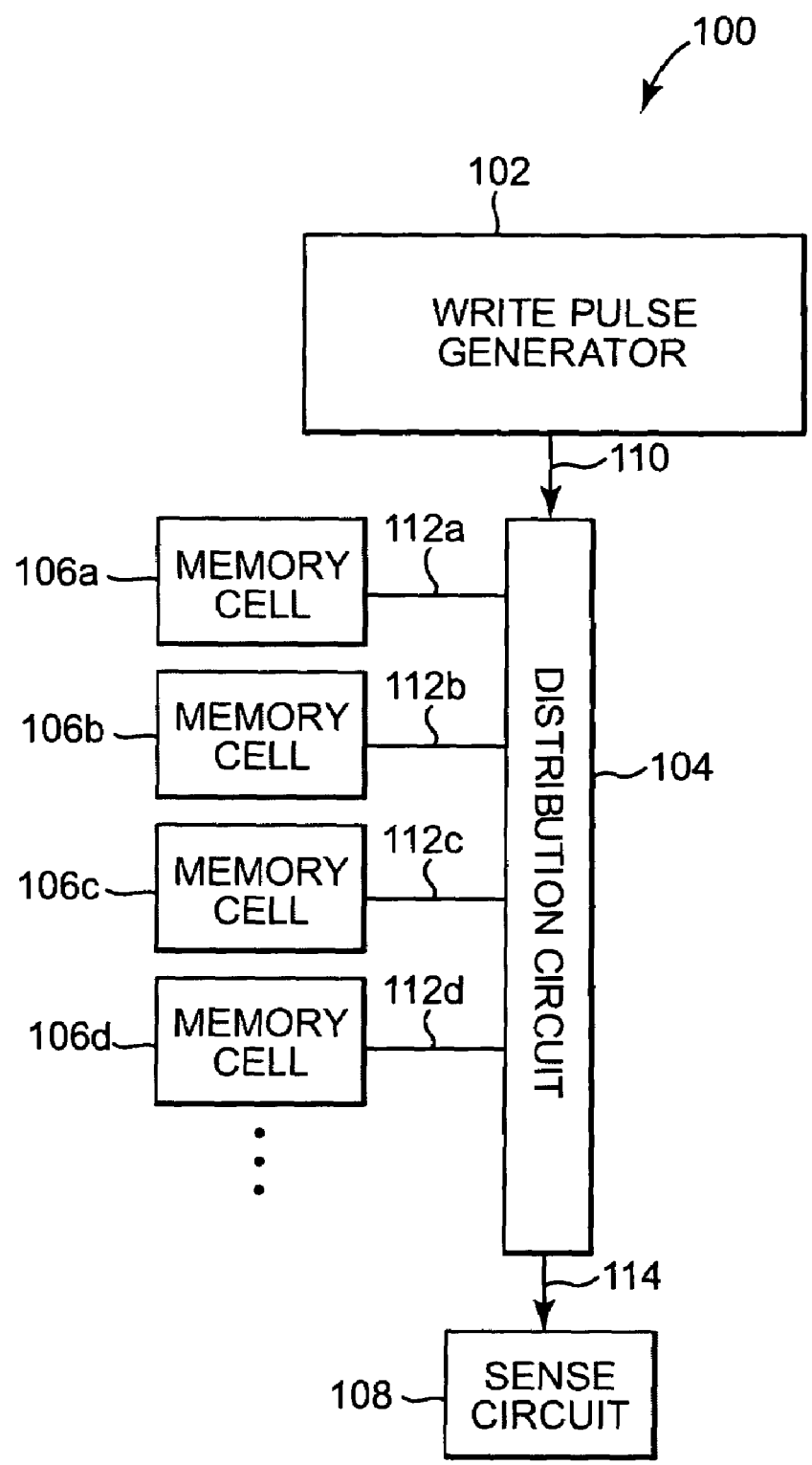
FIG. 1 illustrates a block diagram of one embodiment of a memory device.

FIG. 1 illustrates a block diagram of one embodiment of a memory device 100. Memory device 100 includes a write pulse generator 102, a distribution circuit 104, memory cells 106a, 106b, 106c, and 106d, and a sense circuit 108. In one embodiment, memory cells 106a-106d are phase-change memory cells that are based on the amorphous to crystalline phase transition of the memory material. Write pulse generator 102 is electrically coupled to distribution circuit 104 through signal path 110. Distribution circuit 104 is electrically coupled to memory cells 106a-106d through signal paths 112a-112d, respectively, and to sense circuit 108 through signal path 114.

Each phase-change memory cell 106a-106d includes phase-change material providing a storage location. The phase-change material of each phase-change memory cell 106a-106d is surrounded by multilayer thermal insulation. The multilayer thermal insulation provides thermal insulation of the active region of the phase-change material. In memory cell geometries where the current flow through the phase-change material is laterally constricted by an electrical insulator such as in pillar memory cells or pore-type memory cells, the multilayer thermal insulation laterally surrounds the phase change material. In other memory cell geometries where the highest current density is defined by small heater electrode dimensions, the multilayer thermal insulation contacts the phase-change material in the horizontal direction. In one embodiment, the multilayer thermal insulation relies on a low thermal conductivity of the insulation material layers and also takes advantage of the significant interface resistance for selected insulation material combinations. As an example of a possible material combination, the thermal boundary resistance of $ZnS:SiO_2$ and GeSbTe can have the same insulating properties as a 5-10 nm thick layer of GeSbTe by itself.

Using multilayer thermal insulation improves the thermal insulation of the phase-change material and hence lower reset power and reduced structural memory cell size can be achieved. In addition, the multilayer thermal insulation can also provide some advantages in terms of integration flow by avoiding the use of additional, non-standard materials for complementary metal-oxide-semiconductor (CMOS) processing. For example, $ZnS:SiO_2$ is a typical thermal insulation material widely used in optical DVD applications. The integration of $ZnS:SiO_2$ into CMOS, however, may not be straight forward, since both Zn and S are novel materials, which may need additional diffusion barriers, contamination control, dedicated equipment, etc.

In one embodiment, write pulse generator 102 generates current or voltage pulses that are controllably directed to memory cells 106a-106d via distribution circuit 104. In one embodiment, distribution circuit 104 includes a plurality of transistors that controllably direct current or voltage pulses to the memory cells.

In one embodiment, memory cells 106a-106d are made of a phase-change material that may be changed from an amorphous state to a crystalline state or from a crystalline state to an amorphous state under influence of temperature change. The degree of crystallinity thereby defines at least two memory states for storing data within memory device 100. The at least two memory states can be assigned to the bit values "0" and "1". The bit states of memory cells 106a-106d differ significantly in their electrical resistivity. In the amorphous state, a phase-change material exhibits significantly higher resistivity than in the crystalline state. In this way, sense amplifier 108 reads the cell resistance such that the bit value assigned to a particular memory cell 106a-106d is determined.

To program a memory cell 106a-106d within memory device 100, write pulse generator 102 generates a current or voltage pulse for heating the phase-change material in the target memory cell. In one embodiment, write pulse generator 102 generates an appropriate current or voltage pulse, which is fed into distribution circuit 104 and distributed to the appropriate target memory cell 106a-106d. The current or voltage pulse amplitude and duration is controlled depending on whether the memory cell is being set or reset. Generally, a "set" operation of a memory cell is heating the phase-change material of the target memory cell above its crystallization temperature (but below its melting temperature) long enough to achieve the crystalline state. Generally, a "reset" operation of a memory cell is heating the phase-change material of the target memory cell above its melting temperature, and then quickly quench cooling the material, thereby achieving the amorphous state.

Figure 2:
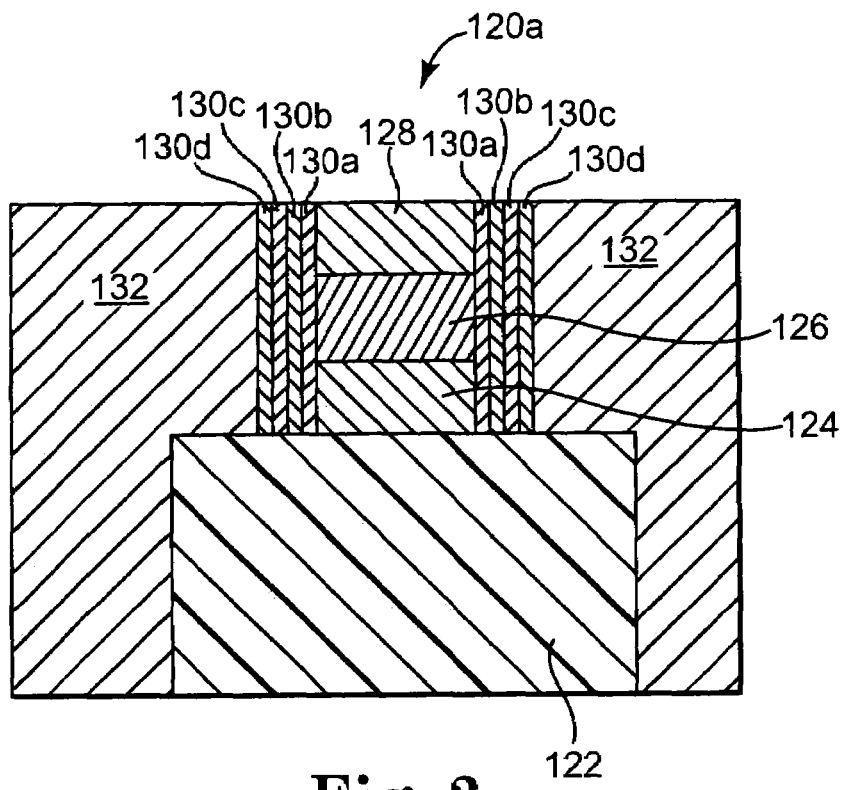
FIG. 2 illustrates a cross-sectional view of one embodiment of a phase-change memory cell.

FIG. 2 illustrates a cross-sectional view of one embodiment of a phase-change memory cell 120a. In one embodiment, phase-change memory cell 120a is a pillar phase-change memory cell. Phase-change memory cell 120a includes contact plug 122, first electrode 124, phase-change material 126, second electrode 128, thermal insulation material layers 130a, 130b, 130c, and 130d, and dielectric material 132. Thermal insulation material layers 130a-130d are collectively referred to as multilayer thermal insulation 130. Phase-change material 126 is laterally completely enclosed by thermal insulation material layers 130a-130d. In one embodiment, thermal insulation material layer 130a is an electric insulator, which defines the current path and hence the location of the phase-change region in phase-change material 126. Phase-change material 126 provides a storage location for storing one bit or several bits of data. A selection device, such as an active device like a transistor or diode, is coupled to contact plug 122 to control the application of current or voltage to first electrode 124, and thus to phase-change material 126, to set and reset phase-change material 126.

Thermal insulation material layers 130a-130d can comprise a suitable combination of $SiO_2$, $Al_2O_3$, AlN, GeSbTe, $GeO_x$, $TiO_2$, TiON, $TaO_x$, GeTe, GeN, GaN, GeSb, SiON, SiN, low-k dielectrics, xerogels, aerogels, $ZnS—SiO_2$, silica-based porous dielectrics, polymer-based dielectrics, silsesquioxane-based dielectrics, or other suitable thermal insulation material layers. In one embodiment, multilayer thermal insulation 130 of phase-change memory cell 120a consists of two individual layers, including thermal insulation material layers 130a and 130b. In other embodiments, any suitable number of thermal insulation material layers 130 can be used. In one embodiment, thermal insulation material layer 130a includes a material having a lower thermal conductivity than the material of thermal insulation material layer 130b, 130c, or 130d. In one embodiment, thermal insulation material layer 130a includes an electrically isolating material. Thermal insulation material layers 130b-130d include electrically isolating materials, semiconducting materials, or metallic materials. Thermal insulation material layers 130 having a higher thermal conductivity should be thinner than thermal insulation material layers 130 having a lower thermal conductivity, such as less than 5-15 nm.

To form multilayer thermal insulation 130, it is advantageous to combine material layers having different physical properties, since this will for example decrease the phonon coupling at the interface between the material layers and provide a more pronounced thermal interface resistance. For example, a combination could include hard $SiO_2$ and relatively soft GeSbTe, or a combination could include SiN and porous low-k materials such as silica-based, polymer-based, or silsesquioxane-based low-k materials.

Phase-change material 126 may be made up of a variety of materials in accordance with the present invention. Generally, chalcogenide alloys that contain one or more elements from group VI of the periodic table are useful as such materials. In one embodiment, phase-change material 126 of memory cell 120a is made up of a chalcogenide compound material, such as GeSbTe, SbTe, GeTe, or AgInSbTe. In another embodiment, the phase-change material can be chalcogen free, such as GeSb, GaSb, InSb, or GeGaInSb. In other embodiments, the phase-change material can be made up of any suitable material including one or more of the elements Ge, Sb, Te, Ga, As, In, Se, and S.

During a set operation of phase-change memory cell 120a, a set current or voltage pulse is selectively enabled to the selection device and sent through contact plug 122 and first electrode 124 to phase-change material 126 thereby heating it above its crystallization temperature (but usually below its melting temperature). In this way, phase-change material 126 reaches its crystalline state during this set operation. During a reset operation of phase-change memory cell 120a, a reset current or voltage pulse is selectively enabled to the selection device and sent through contact plug 122 and first electrode 124 to phase-change material 126. The reset current or voltage quickly heats phase-change material 126 above its melting temperature. After the current or voltage pulse is turned off, phase-change material 126 quickly quench cools into the amorphous state.

Figure 3:
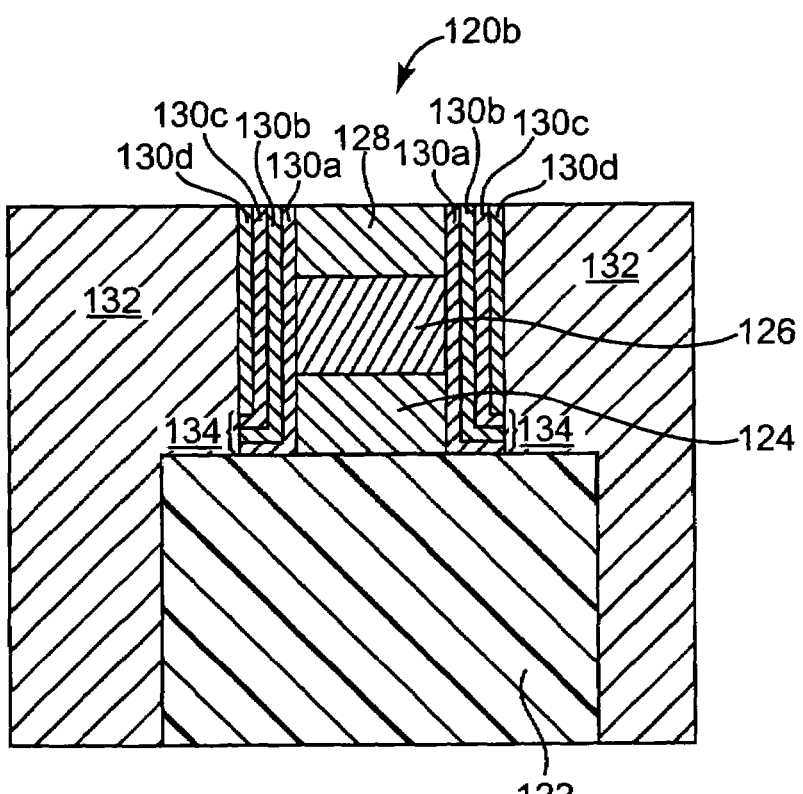
FIG. 3 illustrates a cross-sectional view of another embodiment of a phase-change memory cell.

FIG. 3 illustrates a cross-sectional view of another embodiment of a phase-change memory cell 120b. In one embodiment, phase-change memory cell 120b is a pillar phase-change memory cell. Phase-change memory cell 120b is similar to phase-change memory cell 120a, except thermal insulation material layers 130a-130d include angled portions at 134. Whether thermal insulation material layers 130a-130d include the angled portions at 134 (memory cell 120b) or do not include the angled portions (memory cell 120a of FIG. 2) is based on the fabrication process for the phase-change memory cell as described in further detail below. Phase-change memory cell 120b operates similarly to phase-change memory cell 120a.

Figure 4:
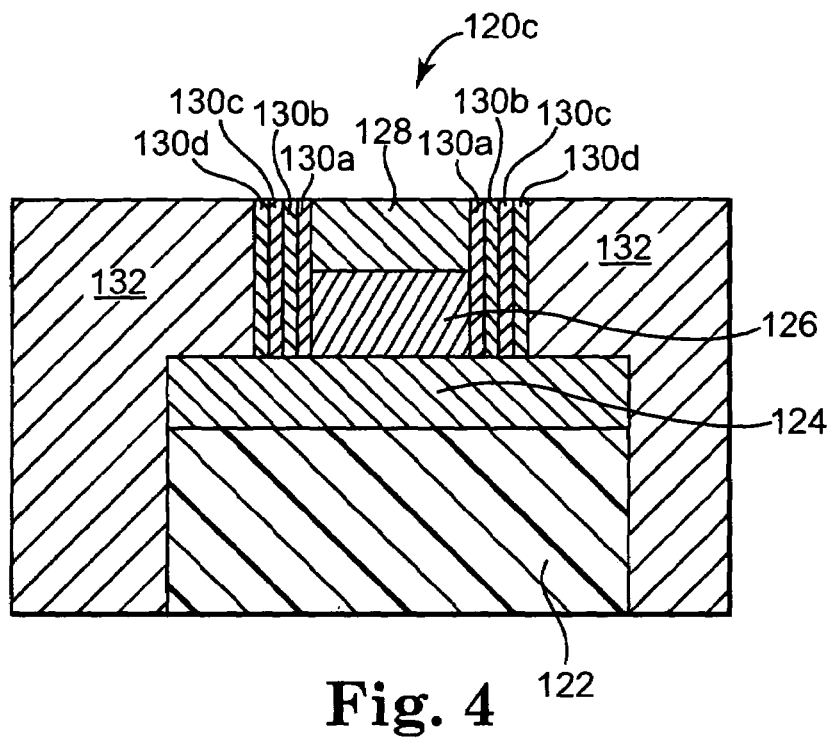
FIG. 4 illustrates a cross-sectional view of another embodiment of a phase-change memory cell.

FIG. 4 illustrates a cross-sectional view of another embodiment of a phase-change memory cell 120c. In one embodiment, phase-change memory cell 120c is an active-in-via phase-change memory cell. Phase-change memory cell 120c is similar to phase-change memory cell 120a, except thermal insulation material layers 130a-130d laterally surround phase-change material 126 and second electrode 128, but not first electrode 124. First electrode 124 has the same width as contact plug 122. In another embodiment, first electrode 124 is excluded and contact plug 122 acts as the first electrode. In another embodiment, thermal insulation material layers 130a-130d include angled portions similar to angled portions 134 illustrated and described with reference to FIG. 3. Phase-change memory cell 120c operates similarly to phase-change memory cell 120a.

The following FIGS. 5-12 illustrate embodiments for fabricating a pillar phase-change memory cell similar to phase-change memory cells 120a and 120b.

Figure 5:
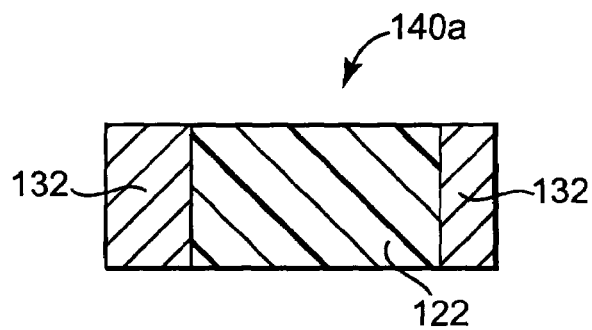
FIG. 5 illustrates a cross-sectional view of one embodiment of a preprocessed wafer.

FIG. 5 illustrates a cross-sectional view of one embodiment of a preprocessed wafer 140a. Preprocessed wafer 140a includes dielectric material 132, contact plug 122, and lower wafer layers (not shown). Contact plug 122 is a tungsten plug, copper plug, or other suitable conducting material plug. Dielectric material 132 is $SiO_2$, fluorinated silica glass (FSG), doped boro-phosphorous silicate glass (BPSG), or other suitable dielectric material.

Figure 6:
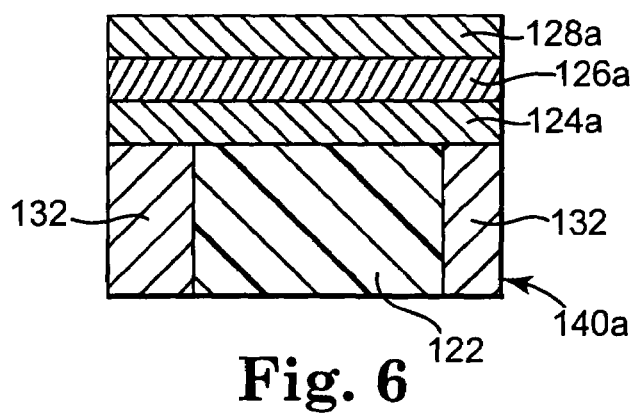
FIG. 6 illustrates a cross-sectional view of one embodiment of the preprocessed wafer, a first electrode material layer, a phase-change material layer, and a second electrode material layer.

FIG. 6 illustrates a cross-sectional view of one embodiment of preprocessed wafer 140a, a first electrode material layer 124a, a phase-change material layer 126a, and a second electrode material layer 128a. Electrode material, such as TiN, TaN, W, Al, Cu, TiSiN, TaSiN, or other suitable electrode material, is deposited over preprocessed wafer 140a to provide first electrode material layer 124a. First electrode material layer 124a is deposited using chemical vapor deposition (CVD), atomic layer deposition (ALD), metal organic chemical vapor deposition (MOCVD), plasma vapor deposition (PVD), jet vapor deposition (JVP), or other suitable deposition technique.

Phase-change material, such as a chalcogenic compound or other suitable phase-change material, is deposited over first electrode material layer 124a to provide phase-change material layer 126a. Phase-change material layer 126a is deposited using CVD, ALD, MOCVD, PVD, JVP, or other suitable deposition technique.

Electrode material, such as TiN, TaN, W, Al, Cu, TiSiN, TaSiN, or other suitable electrode material, is deposited over phase-change material layer 126a to provide second electrode material layer 128a. Second electrode material layer 128a is deposited using CVD, ALD, MOCVD, PVD, JVP, or other suitable deposition technique.

Figure 7:
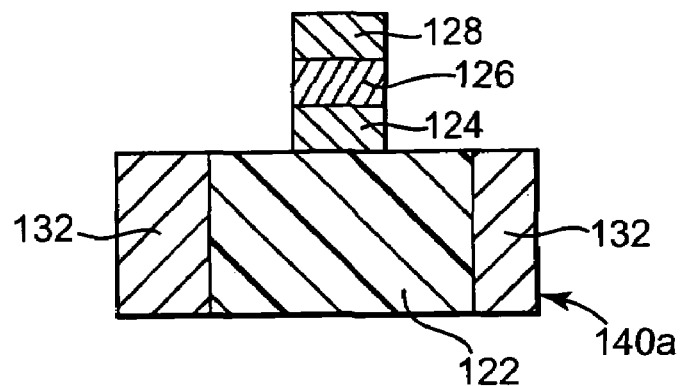
FIG. 7 illustrates a cross-sectional view of one embodiment of the preprocessed wafer, a first electrode, phase-change material, and a second electrode after etching.

FIG. 7 illustrates a cross-sectional view of one embodiment of preprocessed wafer 140a, a first electrode 124, phase-change material 126, and a second electrode 128 after etching second electrode material layer 128a, phase-change material layer 126a, and first electrode material layer 124a. Second electrode material layer 128a is etched to provide second electrode 128. Phase-change material layer 126a is etched to provide phase-change material 126. Phase-change material 126 provides a storage location for storing one bit or several bits of data. First electrode material layer 124a is etched to provide first electrode 124. In one embodiment, first electrode 124, phase-change material 126, and second electrode 128 are substantially centered on contact plug 122.

Figure 8:
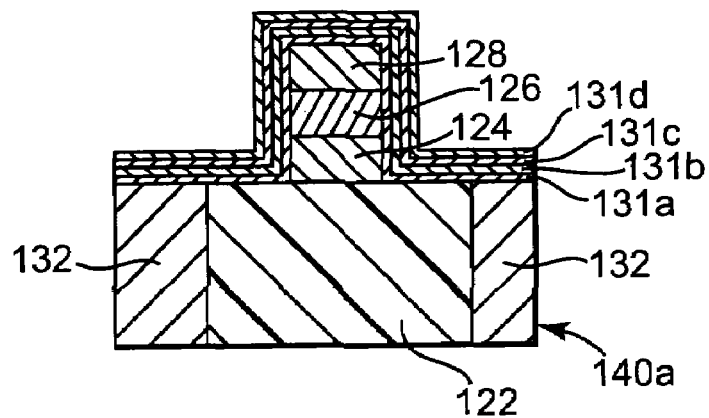
FIG. 8 illustrates a cross-sectional view of one embodiment of the preprocessed wafer, first electrode, phase-change material, second electrode, and multilayer thermal insulation.

FIG. 8 illustrates a cross-sectional view of one embodiment of preprocessed wafer 140a, first electrode 124, phase-change material 126, second electrode 128, a first thermal insulation material layer 131a, a second thermal insulation material layer 131b, a third thermal insulation material layer 131c, and a fourth thermal insulation material layer 131d.

Thermal insulation material, such as $SiO_2$, $Al_2O_3$, AlN, GeN, GaN, SiON, SiN, porous oxide, low-k dielectric, xerogel, aerogel, $GeO_x$, $TiO_2$, TiON, $TaO_x$, $ZnS$—$SiO_2$, silica-based porous dielectric, polymer-based dielectric, silsesquioxane-based dielectric, or other suitable electrically isolating thermal insulation material, is deposited over exposed portions of preprocessed wafer 140*a*, first electrode 124, phase-change material 126, and second electrode 128 to provide first thermal insulation material layer 131*a*. First thermal insulation material layer 131*a* is deposited using CVD, ALD, MOCVD, PVD, JVP, or other suitable deposition technique.

Thermal insulation material, such as $SiO_2$, $Al_2O_3$, AlN, GeSbTe, GeTe, GeN, GaN, GeSb, SiON, SiN, porous oxide, low-k dielectric, xerogel, aerogel, $GeO_x$, $TiO_2$, TiON, $TaO_x$, $ZnS$—$SiO_2$, silica-based porous dielectric, polymer-based dielectric, silsesquioxane-based dielectric, or other suitable electrically isolating, semiconducting, or metallic thermal insulation material different than first thermal insulation material layer 131*a*, is deposited over first thermal insulation material layer 131*a* to provide second thermal insulation material layer 131*b*. Second thermal insulation material layer 131*b* is deposited using CVD, ALD, MOCVD, PVD, JVP, spin-on, or other suitable deposition technique.

Likewise, thermal insulation material different than second thermal insulation material layer 131*b* is deposited over second thermal insulation material layer 131*b* to provide third thermal insulation material layer 131*c*. Thermal insulation material different than third thermal insulation material layer 131*c* is deposited over third thermal insulation material layer 131*c* to provide thermal insulation material layer 131*d*. In other embodiments, any suitable number of additional thermal insulation material layers 131 can be deposited over thermal insulation material layer 131*d*. In other embodiments, thermal insulation material layers 131*c* and 131*d* can be eliminated leaving only thermal insulation material layers 131*a* and 131*b*.

In one embodiment, first thermal insulation material layer 131*a* includes the same material as third thermal insulation material layer 131*c*, and second thermal insulation material layer 131*b* includes the same material as fourth thermal insulation material layer 131*d*. In one embodiment, thermal insulation material layers 131*a* and 131*c* include a porous oxide material, and thermal insulation material layers 131*b* and 131*d* include a nitride material, such as SiN. In other embodiments, other combinations of materials are possible.

Figure 9:
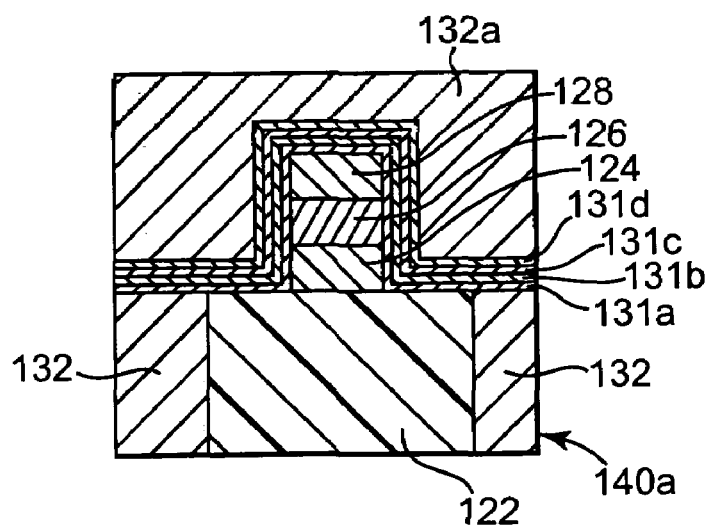
FIG. 9 illustrates a cross-sectional view of one embodiment of the preprocessed wafer, first electrode, phase-change material, second electrode, multilayer thermal insulation, and a dielectric material.

FIG. 9 illustrates a cross-sectional view of one embodiment of preprocessed wafer 140*a*, first electrode 124, phase-change material 126, second electrode 128, thermal insulation material layers 131*a*-131*d*, and dielectric material 132*a*. Dielectric material, such as $SiO_2$, FSG, BPSG, or other suitable dielectric material, is deposited over fourth thermal insulation material layer 131*d* to provide dielectric material 132*a*. Dielectric material 132*a* is deposited using CVD, ALD, MOCVD, PVD, JVP, spin-on, or other suitable deposition technique.

Figure 10:
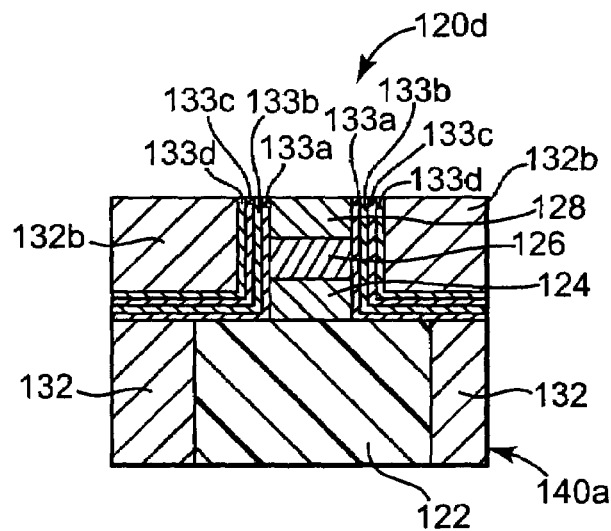
FIG. 10 illustrates a cross-sectional view of one embodiment of the preprocessed wafer, first electrode, phase-change material, second electrode, multilayer thermal insulation, and dielectric material after planarization.

FIG. 10 illustrates a cross-sectional view of one embodiment of preprocessed wafer 140*a*, first electrode 124, phase-change material 126, second electrode 128, thermal insulation material layers 133*a*-133*d*, and dielectric material 132*b* after planarizing dielectric material 132*a* and thermal insulation material layers 131*a*-131*d*. Dielectric material 132*a* and thermal insulation material layers 131*a*-131*d* are planarized to expose second electrode 128. Dielectric material 132*a* and thermal insulation material layers 131*a*-131*d* are planarized using chemical mechanical planarization (CMP) or another suitable planarization process to provide phase-change memory cell 120*d*. Phase-change memory cell 120*d* is similar to phase-change memory cells 120*a* and 120*b*, except that the portions of thermal insulation material layers 133*a*-133*d* parallel to preprocessed wafer 140*a* are not etched away. Phase-change memory cell 120*d* operates similarly to phase-change memory cell 120*a*.

Figure 11:
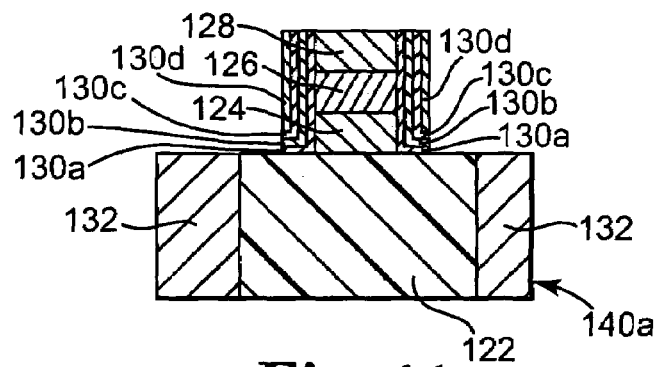
FIG. 11 illustrates a cross-sectional view of one embodiment of the preprocessed wafer, first electrode, phase-change material, second electrode, and multilayer thermal insulation after etching.

FIG. 11 illustrates a cross-sectional view of one embodiment of preprocessed wafer 140*a*, first electrode 124, phase-change material 126, second electrode 128, and thermal insulation material layers 130*a*-130*d* after etching thermal insulation material layers 131*a*-131*d* in an alternative fabrication process following the fabrication step illustrated and described with reference to FIG. 8. Thermal insulation material layers 131*a*-131*d* are etched to expose preprocessed wafer 140*a* and second electrode 128 and provide thermal insulation material layers 130*a*-130*d*.

In another embodiment, each thermal insulation material layer 131 is deposited and then etched to provide a thermal insulation material layer 130 before the next thermal insulation material layer 131 is deposited. In this embodiment, the angled portions 134 (FIG. 3) are not formed.

Figure 12:
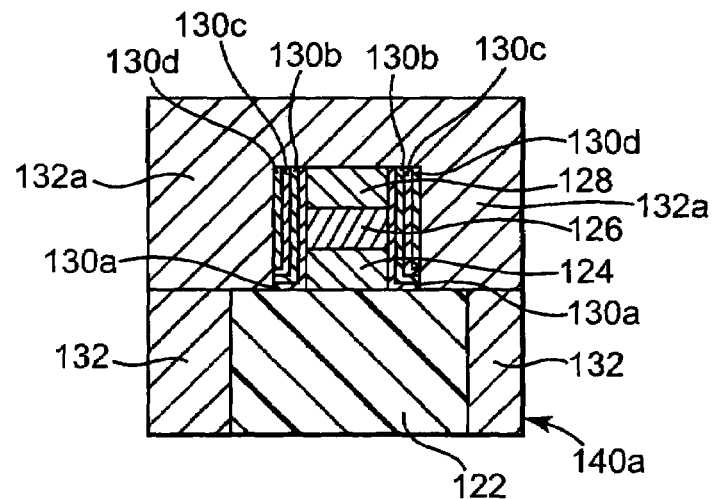
FIG. 12 illustrates a cross-sectional view of one embodiment of the preprocessed wafer, first electrode, phase-change material, second electrode, multilayer thermal insulation, and a dielectric material.

FIG. 12 illustrates a cross-sectional view of one embodiment of preprocessed wafer 140*a*, first electrode 124, phase-change material 126, second electrode 128, thermal insulation material layers 130*a*-130*d*, and dielectric material 132*a*. Dielectric material, such as $SiO_2$, FSG, BPSG, or other suitable dielectric material, is deposited over exposed portions of preprocessed wafer 140*a* and insulation material layers 130*a*-130*d*. Dielectric material 132*a* is deposited using CVD, ALD, MOCVD, PVD, JVP, or other suitable deposition technique. Dielectric material 132*a* is planarized to exposed second electrode 128. Dielectric material 132*a* is planarized using CMP or another suitable planarization process to provide phase-change memory cell 120*b* as illustrated in FIG. 3.

The following FIGS. 13-21 illustrate embodiments for fabricating an active-in-via phase-change memory cell similar to phase-change memory cell 120*c*.

Figure 13:
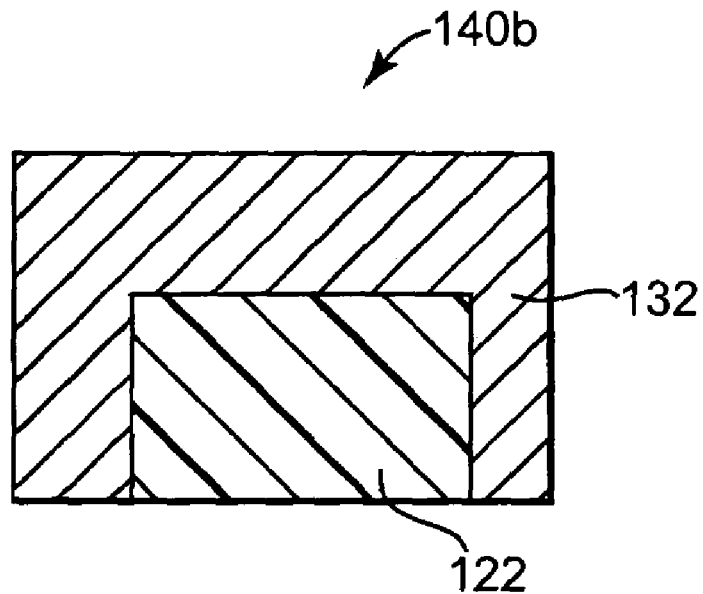
FIG. 13 illustrates a cross-sectional view of another embodiment of a preprocessed wafer.

FIG. 13 illustrates a cross-sectional view of one embodiment of a preprocessed wafer 140*b*. Preprocessed wafer 140*b* includes dielectric material 132, contact plug 122, and lower wafer layers (not shown). In one embodiment, contact plug 122 is a tungsten plug, copper plug, or other suitable conducting material plug. Contact plug 122 provides a first electrode. Dielectric material 132 is $SiO_2$, FSG, BPSG, or other suitable dielectric material. Dielectric material 132 surrounds the sides and top of contact plug 122.

Figure 14:
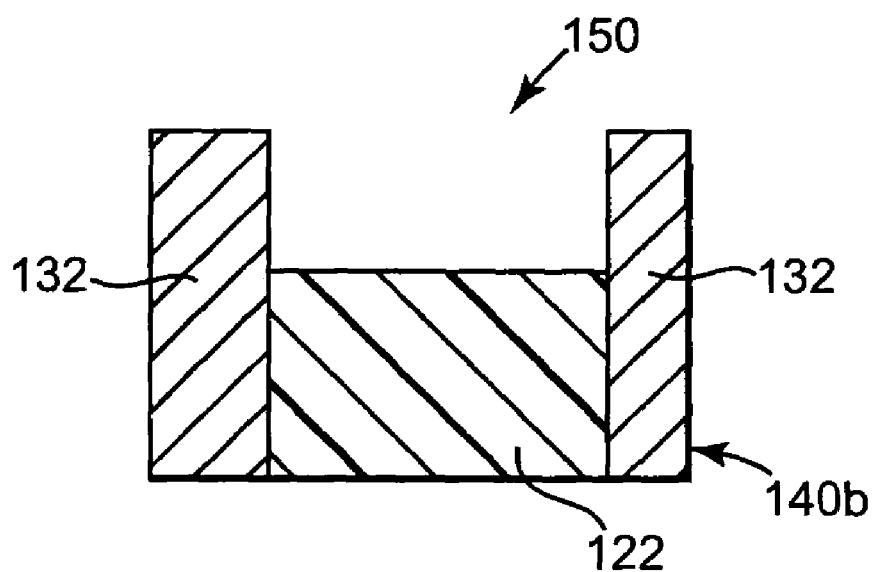
FIG. 14 illustrates a cross-sectional view of one embodiment of the preprocessed wafer after etching an opening in the preprocessed wafer.

FIG. 14 illustrates a cross-sectional view of one embodiment of preprocessed wafer 140*b* after etching. Dielectric material 132 is etched to expose contact plug 122 to provide opening 150. In another embodiment, a portion of contact plug 122 is etched to provide opening 150.

Figure 15:
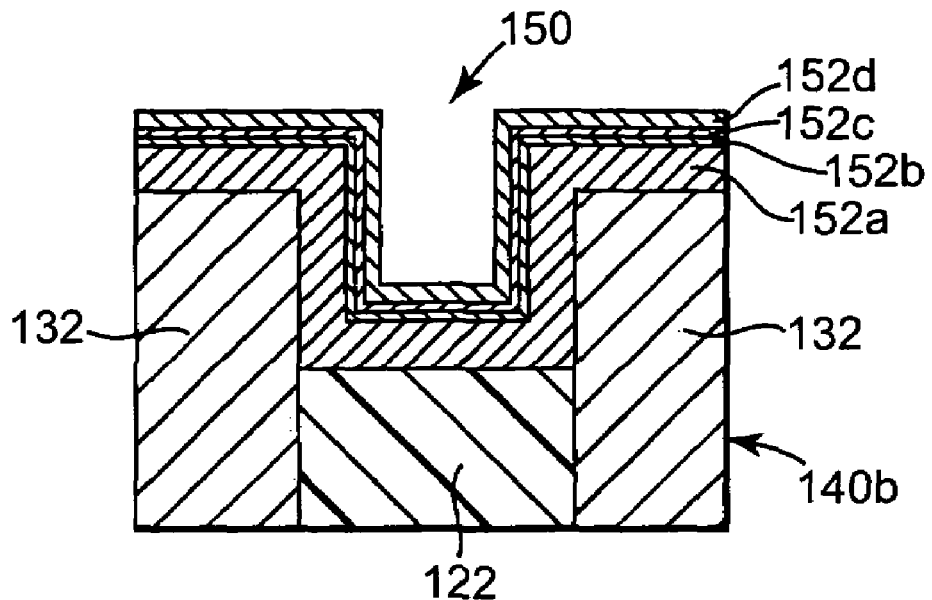
FIG. 15 illustrates a cross-sectional view of one embodiment of the preprocessed wafer and thermal insulation material layers.

FIG. 15 illustrates a cross-sectional view of one embodiment of preprocessed wafer 140*b*, a first thermal insulation material layer 152*a*, a second thermal insulation material layer 152*b*, a third thermal insulation material layer 152*c*, and a fourth thermal insulation material layer 152*d*. Thermal insulation material, such as $SiO_2$, $Al_2O_3$, AlN, GeSbTe, GeTe, GeN, GaN, GeSb, SiON, SiN, porous oxide, or other suitable thermal insulation material, is deposited over preprocessed wafer 140*b* in opening 150 to provide first thermal insulation material layer 152*a*. First thermal insulation material layer 152*a* is deposited using CVD, ALD, MOCVD, PVD, JVP, or other suitable deposition technique. In one embodiment, the thickness of first thermal insulation material layer 152*a* is greater than the thickness of each thermal insulation material layer 152*b*-152*d* to reduce the cross-section or width of opening 150 to a desired width. In one embodiment, first insulation material layer 152a includes the same material as dielectric material 132.

Thermal insulation material, such as $SiO_2$, $Al_2O_3$, AlN, GeSbTe, GeTe, GeN, GaN, GeSb, SiON, SiN, porous oxide, or other suitable electrically isolating, semiconducting, or metallic thermal insulation material different than first thermal insulation material layer 152a, is deposited over first thermal insulation material layer 152a to provide second thermal insulation material layer 152b. Second thermal insulation material layer 152b is deposited using CVD, ALD, MOCVD, PVD, JVP, or other suitable deposition technique.

Likewise, thermal insulation material different than second thermal insulation material layer 152b is deposited over second thermal insulation material layer 152b to provide third thermal insulation material layer 152c. Thermal insulation material different than third thermal insulation material layer 152c is deposited over third insulation material layer 152c to provide fourth thermal insulation material layer 152d. In other embodiments, any suitable number of additional thermal insulation material layers 152 can be deposited over thermal insulation material layer 152d. In other embodiments, thermal insulation material layers 152c and 152d can be eliminated leaving only thermal insulation material layers 152a and 152b. In one embodiment, thermal insulation material layer 152d, or the last thermal insulation material layer 152 deposited, is an electrically isolating material and has the lowest thermal conductivity of the materials used for thermal insulation material layers 152a-152d.

In one embodiment, first thermal insulation material layer 152a includes the same material as third thermal insulation material layer 152c, and second thermal insulation material layer 152b includes the same material as fourth thermal insulation material layer 152d. In one embodiment, thermal insulation material layers 152a and 152c include a porous oxide material, and thermal insulation material layers 152b and 152d include a nitride material, such as SiN. In other embodiments, other combinations of materials are possible.

Figure 16:
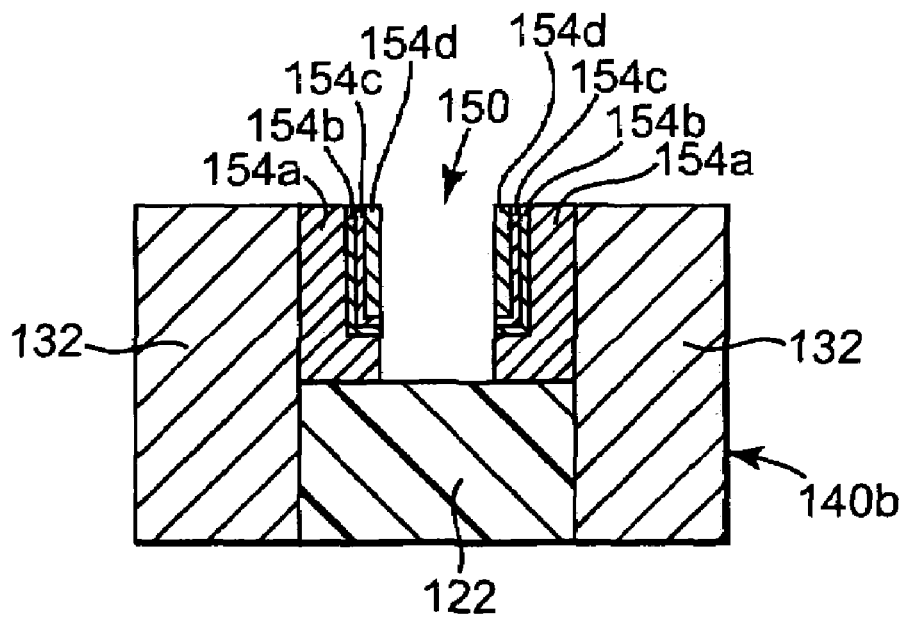
FIG. 16 illustrates a cross-sectional view of one embodiment of the preprocessed wafer and thermal insulation material layers after etching.

FIG. 16 illustrates a cross-sectional view of one embodiment of preprocessed wafer 140b and thermal insulation material layers 154a-154d after etching thermal insulation material layers 152a-152d using a directional reactive ion etch. Fourth thermal insulation material layer 152d is etched to provide fourth thermal insulation material layer 154d. Third thermal insulation material layer 152c is etched to provide third thermal insulation material layer 154c. Second thermal insulation material layer 152b is etched to provide second thermal insulation material layer 154b, and first thermal insulation material layer 152a is etched to provide first thermal insulation material layer 154a. Thermal insulation material layers 152a-152d are etched to expose contact plug 122 and dielectric material 132.

Figure 17:
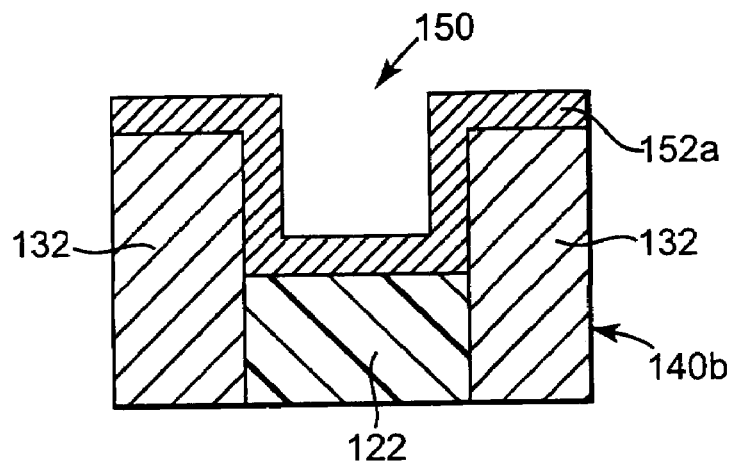
FIG. 17 illustrates a cross-sectional view of one embodiment the preprocessed wafer and a first thermal insulation material layer.

FIG. 17 illustrates a cross-sectional view of one embodiment of preprocessed wafer 140b and first thermal insulation material layer 152a. FIG. 17 illustrates an alternative process for fabricating the phase-change memory cell following the step previously described and illustrated with reference to FIG. 14. Thermal insulation material, such as $SiO_2$, $Al_2O_3$, AlN, GeSbTe, GeTe, GeN, GaN, GeSb, SiON, SiN, porous oxide, or other suitable electrically isolating, semiconducting, or metallic thermal insulation material, is deposited over preprocessed wafer 140b to provide first thermal insulation material layer 152a. First thermal insulation material layer 152a is deposited using CVD, ALD, MOCVD, PVD, JVP, or other suitable deposition technique. In one embodiment, the thickness of first thermal insulation material layer 152a is selected to reduce the cross-section or width of opening 150 to a desired sublithographic width. In one embodiment, first insulation material layer 152a includes the same material as dielectric material 132.

Figure 18:
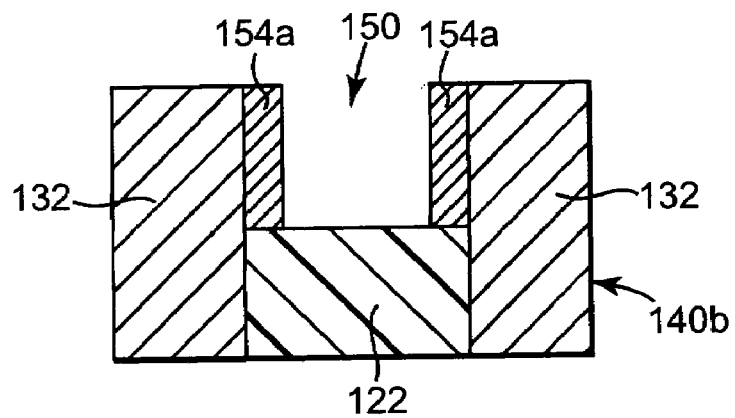
FIG. 18 illustrates a cross-sectional view of one embodiment of the preprocessed wafer and first thermal insulation material layer after etching.

FIG. 18 illustrates a cross-sectional view of one embodiment of preprocessed wafer 140b and first thermal insulation material layer 154a after etching first thermal insulation material layer 152a. First insulation material layer 152a is etched to expose contact plug 122 and dielectric material 132 to provide first insulation material layer 154a on the walls of opening 150.

Figure 19:
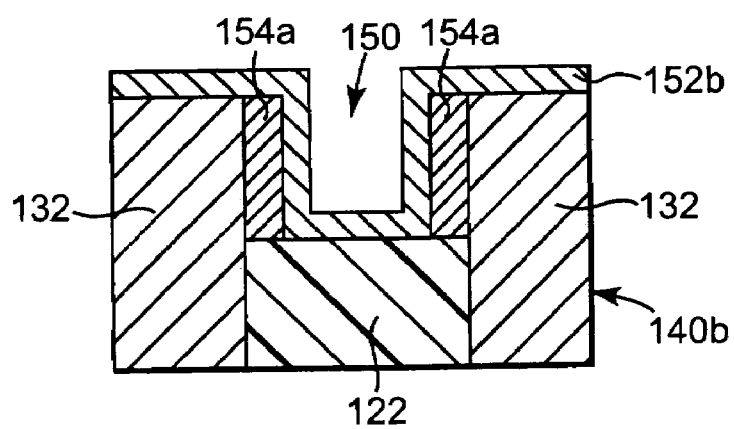
FIG. 19 illustrates a cross-sectional view of one embodiment of the preprocessed wafer, first thermal insulation material layer, and a second thermal insulation material layer.

FIG. 19 illustrates a cross-sectional view of one embodiment of preprocessed wafer 140b, first thermal insulation material layer 154a, and a second thermal insulation material layer 152b. Thermal insulation material, such as $SiO_2$, $Al_2O_3$, AlN, GeSbTe, GeTe, GeN, GaN, GeSb, SiON, SiN, porous oxide, or other suitable electrically isolating, semiconducting, or metallic thermal insulation material different than first thermal insulation material layer 154a, is deposited over exposed portions of preprocessed wafer 140b and first thermal insulation material layer 154a to provide second thermal insulation material layer 152b. Second thermal insulation material layer 152b is deposited using CVD, ALD, MOCVD, PVD, JVP, or other suitable deposition technique.

Figure 20:
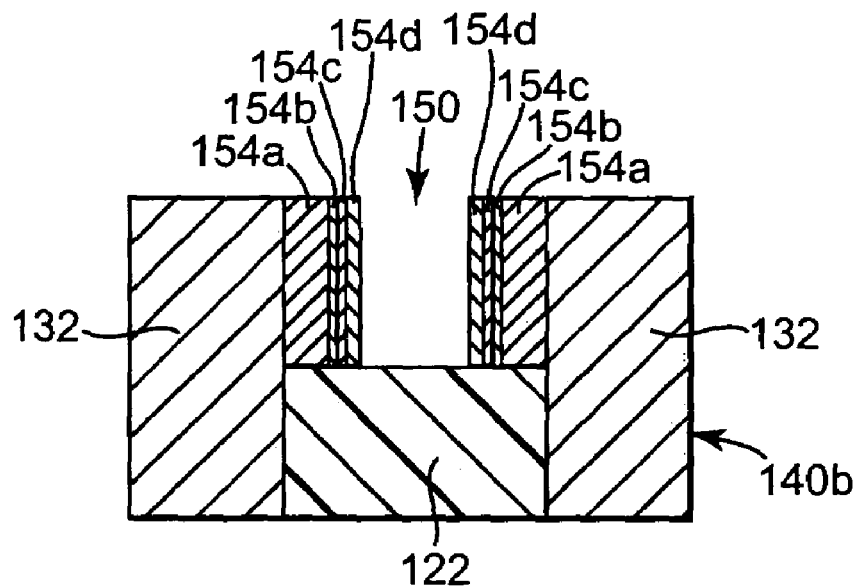
FIG. 20 illustrates a cross-sectional view of one embodiment of the preprocessed wafer and thermal insulation material layers after etching.

FIG. 20 illustrates a cross-sectional view of one embodiment of preprocessed wafer 140b and thermal insulation material layers 154a-154d. Second thermal insulation material layer 152b is etched to provide second thermal insulation material layer 154b exposing contact plug 122 and dielectric material 132. The steps of depositing and etching a thermal insulation material layer as previously described and illustrated with reference to FIGS. 18 and 19 are repeated to provide third thermal insulation material layer 154c and fourth thermal insulation material layer 154d. In other embodiments, any suitable number of additional thermal insulation material layers 152 can be deposited over thermal insulation material layer 154d and etched to provide another thermal insulation material layer 154. In other embodiments, thermal insulation material layer 154c and/or 154d can be eliminated leaving only thermal insulation material layers 154a and 154b or 154a-154c. Thermal insulation material layer 154d, or the last thermal insulation material layer 154 deposited, is an electrically isolating material.

In one embodiment, first thermal insulation material layer 154a includes the same material as third thermal insulation material layer 154c, and second thermal insulation material layer 154b includes the same material as fourth thermal insulation material layer 154d. In one embodiment, thermal insulation material layers 154a and 154c include a porous oxide material, and thermal insulation material layers 154b and 154d include a nitride material, such as SiN. In other embodiments, other combinations of materials are possible. FIG. 20 illustrates a similar stage in the phase-change memory cell fabrication process as illustrated in FIG. 16. The remaining process steps are the same for both embodiments.

Figure 21:
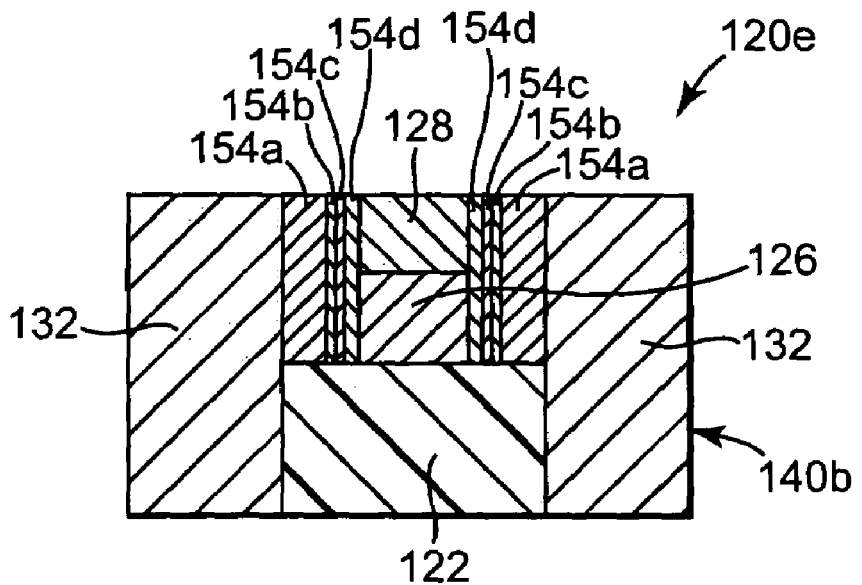
FIG. 21 illustrates a cross-sectional view of one embodiment of the preprocessed wafer, thermal insulation material layers, phase-change material, and a second electrode.

FIG. 21 illustrates a cross-sectional view of one embodiment of a preprocessed wafer 140b, thermal insulation material layers 154a-154d, phase-change material 126, and a second electrode 128. Phase-change material, such as a chalcogenic compound or other suitable phase-change material, is deposited over contact plug 122 in opening 150 to provide phase-change material 126. Phase-change material 126 provides a storage location for storing one bit or several bits of data. Phase-change material 126 is deposited using CVD, ALD, MOCVD, PVD, JVP, or other suitable deposition technique.

Electrode material, such as TiN, TaN, W, Al, Cu, TiSiN, TaSiN, or other suitable electrode material, is deposited over phase-change material 126 in opening 150 to provide second electrode 128. Second electrode 128 is deposited using CVD, ALD, MOCVD, PVD, JVP, or other suitable deposition technique to provide phase-change memory cell 120e. Phase-change memory cell 120e operates similarly to phase-change memory cell 120a.

Figure 22:
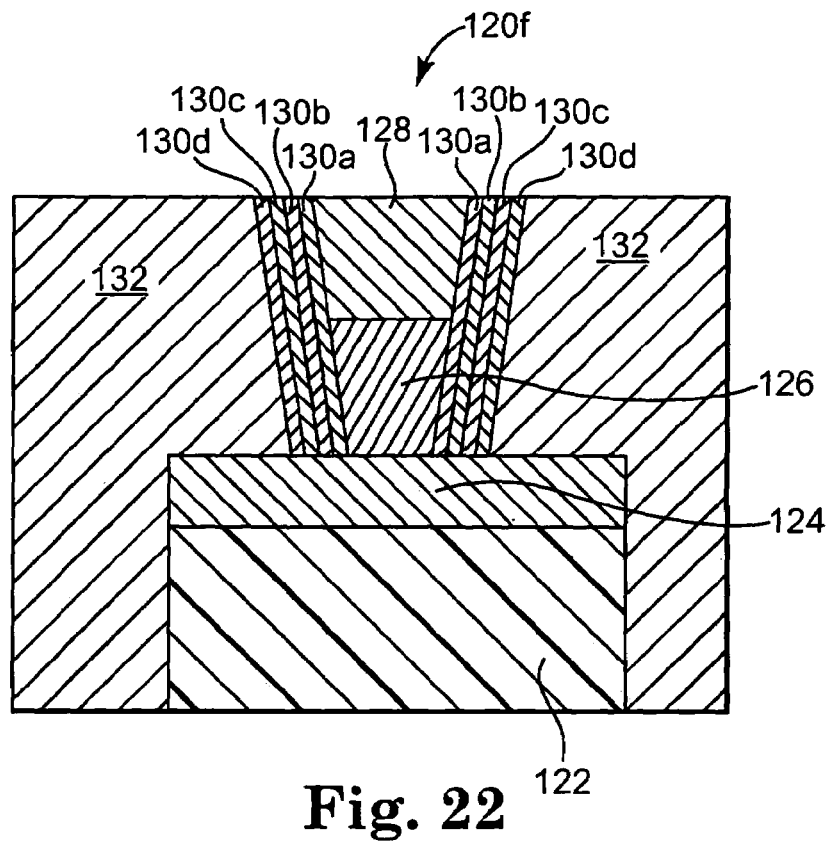
FIG. 22 illustrates a cross-sectional view of another embodiment of a phase-change memory cell.

FIG. 22 illustrates a cross-sectional view of another embodiment of a phase-change memory cell 120f. In one embodiment, phase-change memory cell 120f is an active-in-via phase-change memory cell. Phase-change memory cell 120f is similar to phase-change memory cell 120c, except thermal insulation material layers 130a-130d, phase-change material 126, and second electrode 128 have tapered sidewalls. Phase-change memory cell 120f can be fabricated using a process similar to the process previously described and illustrated with reference to FIGS. 13-21, except that opening 150 is etched with tapered sidewalls. Phase-change memory cell 120f operates similarly to phase-change memory cell 120a.

Figure 23:
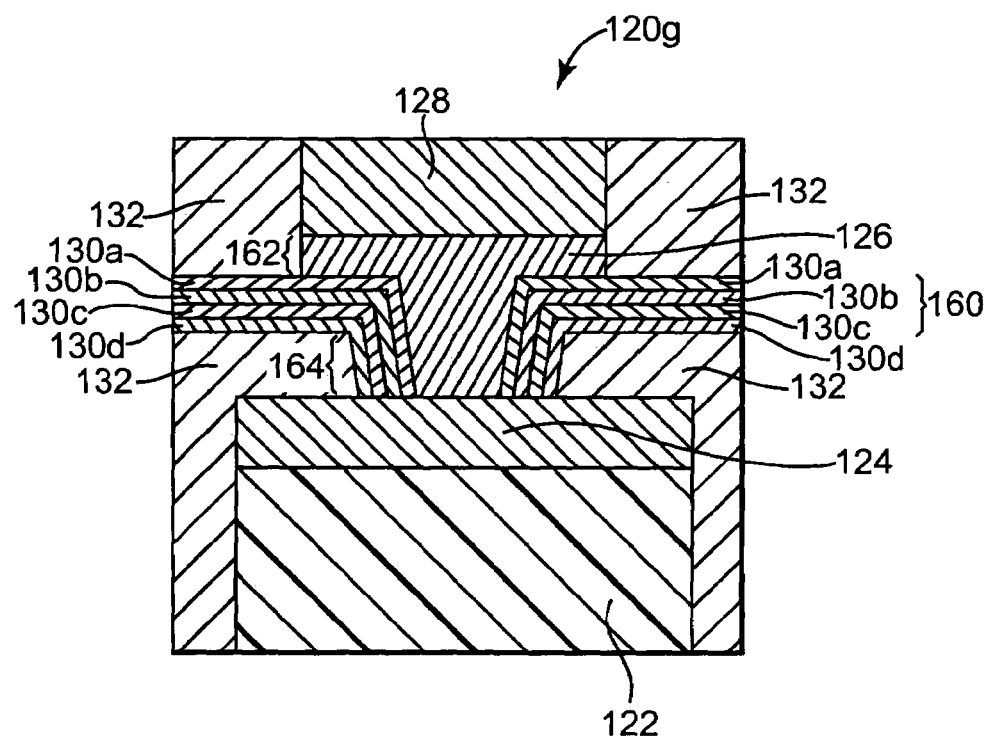
FIG. 23 illustrates a cross-sectional view of another embodiment of a phase-change memory cell.

FIG. 23 illustrates a cross-sectional view of another embodiment of a phase-change memory cell 120g. In one embodiment, phase-change memory cell 120g is an active-in-via phase-change memory cell. Phase-change memory cell 120g is similar to phase-change memory cell 120f, except a portion 160 of thermal insulation material layers 130a-130d are substantially parallel to first electrode 124 and a portion 162 of phase-change material 126 is deposited on part of portion 160 of thermal insulation material layers 130a-130d. Portion 164 of thermal insulation material layers 130a-130d and the portion of phase-change material 126 under portion 162 have tapered sidewalls. Phase-change memory cell 120g can be fabricated using a process similar to the process previously described and illustrated with reference to FIGS. 13-21. Phase-change memory cell 120g operates similarly to phase-change memory cell 120a.

Figure 24A:
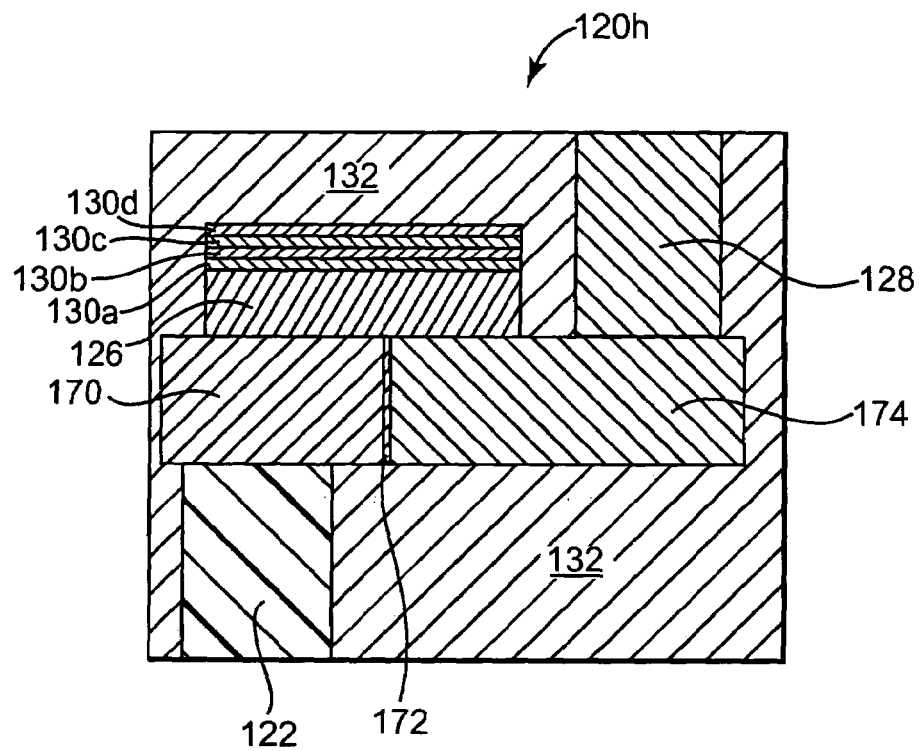
FIG. 24A illustrates a cross-sectional view of another embodiment of a phase-change memory cell.
Figure 24B:
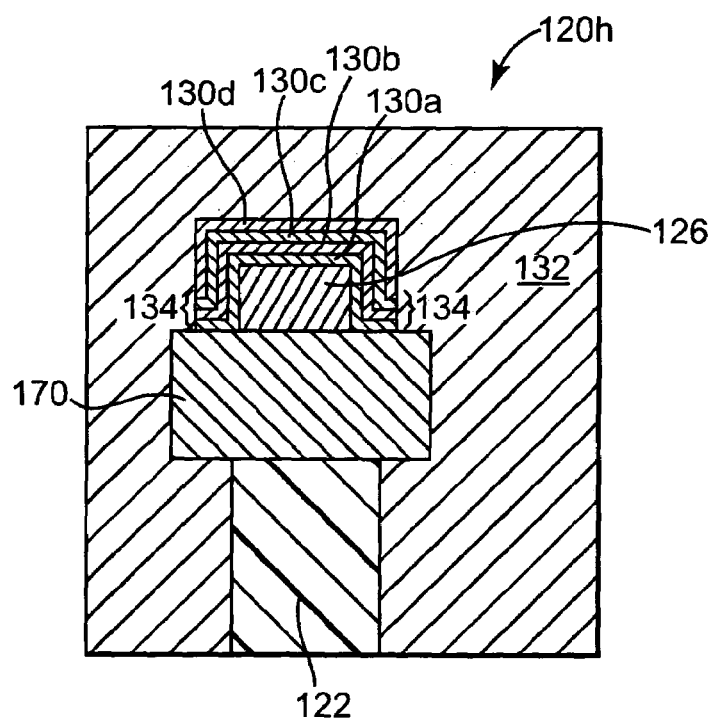
FIG. 24B illustrates a side cross-sectional view of the embodiment of the phase-change memory cell illustrated in FIG. 24A.

FIG. 24A illustrates a cross-sectional view of another embodiment of a phase-change memory cell 120h, and FIG. 24B illustrates a side cross-sectional view of phase-change memory cell 120h. In one embodiment, phase-change memory cell 120h is a bridge phase-change memory cell. Phase-change memory cell 120h includes contact plug 122, a first contact or electrode 170, phase-change material 126, a second contact or electrode 174, a spacer 172, second electrode 128, thermal insulation material layers 130a-130d, and dielectric material 132. Phase-change material 126 provides a storage location for storing one bit, two bits, or several bits of data.

Phase-change material 126 contacts first contact 170 and second contact 174 separated by spacer 172. First contact 170 contacts contact plug 122 and second contact 174 contacts second electrode 128. Except for the phase-change material contacting contacts 170 and 174 and spacer 172, phase-change material 126 is surrounded by thermal insulation material layers 130a-130d. In one embodiment, thermal insulation material layers 130a-130d include angled portions 134. Phase-change memory cell 120h operates similarly to phase-change memory cell 120a.

Figure 25:
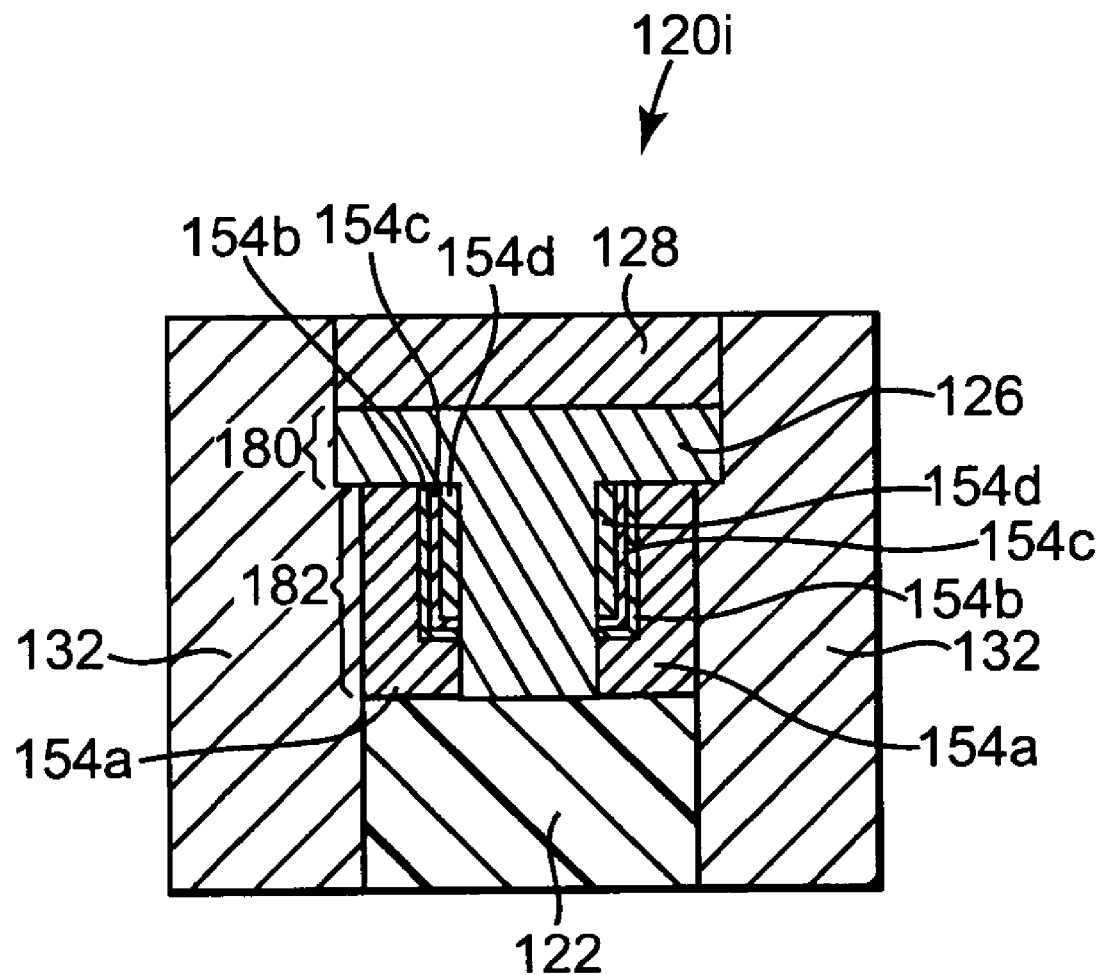
FIG. 25 illustrates a cross-sectional view of another embodiment of a phase-change memory cell.

FIG. 25 illustrates a cross-sectional view of another embodiment of a phase-change memory cell 120i. In one embodiment, phase-change memory cell 120i is an active-in-via phase-change memory cell. Phase-change memory cell 120i is similar to phase-change memory cell 120e, except phase-change material 126 extends over the top of thermal insulation material layers 154a-154d and second electrode 128 is surrounded by dielectric material 132. Phase-change material 126 includes a first portion 182 contacting contact plug 122 and a second portion 180 contacting second electrode 128. First portion 182 of phase-change material 126 is laterally completely enclosed by thermal insulation material layers 154a-154d. Second portion 180 of phase-change material 126 is laterally completely enclosed by dielectric material 132. First portion 182 and second portion 180 of phase-change material 126 completely enclose the open ends of thermal insulation material layers 154a-154d preventing thermal conduction to contact plug 122 and second electrode 128. Phase-change memory cell 120i can be fabricated using a process similar to the process previously described and illustrated with reference to FIGS. 13-21. Phase-change memory cell 120i operates similarly to phase-change memory cell 120a.

Figure 26:
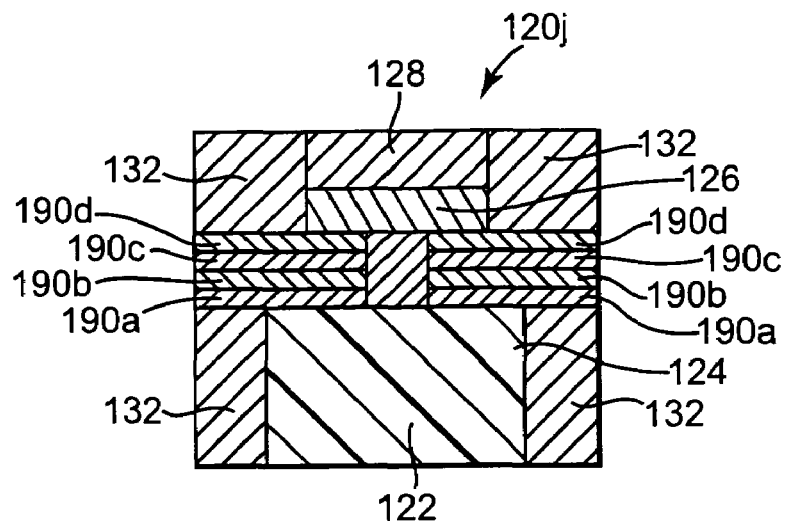
FIG. 26 illustrates a cross-sectional view of another embodiment of a phase-change memory cell.

FIG. 26 illustrates a cross-sectional view of another embodiment of a phase-change memory cell 120j. In one embodiment, phase-change memory cell 120j is a heater or mushroom phase-change memory cell. Phase-change memory cell 120j includes contact plug 122, first electrode or heater 124, phase-change material 126, second electrode 128, thermal insulation material layers 190a, 190b, 190c, and 190d, and dielectric material 132. Thermal insulation material layers 190a-190d are collectively referred to as multilayer thermal insulation 190. Heater material or first electrode 124 is laterally completely enclosed by thermal insulation material layers 190a-190d, which defines the current path and hence the location of the phase-change region in phase-change material 126. Phase-change material 126 provides a storage location for storing one bit or several bits of data. A selection device, such as an active device like a transistor or diode, is coupled to contact plug 122 to control the application of current or voltage to first electrode or heater 124, and thus to phase-change material 126, to set and reset phase-change material 126.

Thermal insulation material layers 190a-190d can comprise a suitable combination of $SiO_2$, $Al_2O_3$, AlN, $GeO_x$, $TiO_2$, TiON, $TaO_x$, GeN, GaN, SiON, SiN, low-k dielectrics, xerogels, aerogels, ZnS—$SiO_2$, silica-based porous dielectrics, polymer-based dielectrics, silsesquioxane-based dielectrics, or other suitable thermal insulation material layers. In one embodiment, multilayer thermal insulation 190 of phase-change memory cell 120j consists of two individual layers, including thermal insulation material layers 190a and 190b, where thermal insulation material layer 190b contacts phase-change material 126. In other embodiments, any suitable number of thermal insulation material layers 190 can be used. In one embodiment, thermal insulation material layer 190d includes a material having a lower thermal conductivity than the material of thermal insulation material layer 190a, 190b, or 190c. In one embodiment, thermal insulation material layer 190d includes an electrically isolating material. Thermal insulation material layers 190a-190c include electrically isolating materials, semiconducting materials, or metallic materials. Thermal insulation material layers 190 having a higher thermal conductivity should be thinner than thermal insulation material layers 190 having a lower thermal conductivity, such as less than 5-15 nm.

During a set operation of phase-change memory cell 120j, a set current or voltage pulse is selectively enabled to the selection device and sent through contact plug 122 and first electrode or heater 124 to phase-change material 126 thereby heating it above its crystallization temperature (but usually below its melting temperature). In this way, phase-change material 126 reaches its crystalline state during this set operation. During a reset operation of phase-change memory cell 120j, a reset current or voltage pulse is selectively enabled to the selection device and sent through contact plug 122 and first electrode or heater 124 to phase-change material 126.

The reset current or voltage quickly heats phase-change material 126 above its melting temperature. After the current or voltage pulse is turned off, phase-change material 126 quickly quench cools into the amorphous state.

The following FIGS. 27-30 illustrate embodiments for fabricating a heater or mushroom phase-change memory cell similar to phase-change memory cell 120j.

Figure 27:
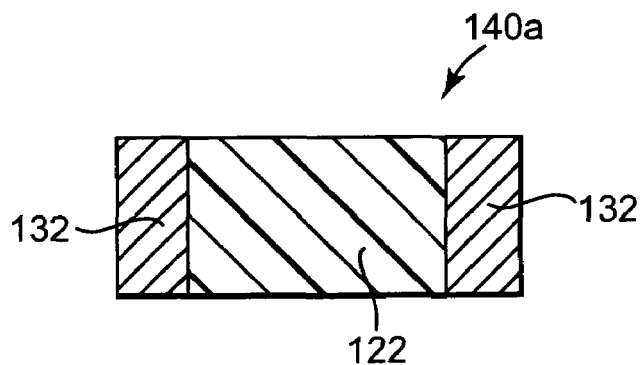
FIG. 27 illustrates a cross-sectional view of one embodiment of a preprocessed wafer.

FIG. 27 illustrates a cross-sectional view of one embodiment of a preprocessed wafer 140a. Preprocessed wafer 140a includes dielectric material 132, contact plug 122, and lower wafer layers (not shown). Contact plug 122 is a tungsten plug, copper plug, or other suitable conducting material plug. Dielectric material 132 is $SiO_2$, FSG, BPSG, or other suitable dielectric material.

Figure 28:
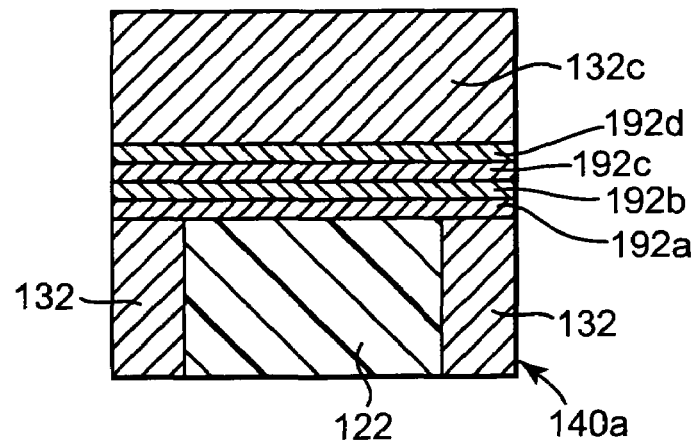
FIG. 28 illustrates a cross-sectional view of one embodiment of the preprocessed wafer, thermal insulation material layers, and a sacrificial material layer.

FIG. 28 illustrates a cross-sectional view of one embodiment of preprocessed wafer 140a, a first thermal insulation material layer 192a, a second thermal insulation material layer 192b, a third thermal insulation material layer 192c, a fourth thermal insulation material layer 192d, and a sacrificial material layer 132c. Thermal insulation material, such as $SiO_2$, $Al_2O_3$, FSG, BPSG, AlN, GeN, GaN, SiON, SiN, porous oxide, low-k dielectric, xerogel, aerogel, $GeO_x$, $TiO_2$, TiON, $TaO_x$, ZnS—$SiO_2$, silica-based porous dielectric, polymer-based dielectric, silsesquioxane-based dielectric, or other suitable electrically isolating or semiconducting thermal insulation material, is deposited over preprocessed wafer 140a to provide first thermal insulation material layer 192a. First thermal insulation material layer 192a is deposited using CVD, ALD, MOCVD, PVD, JVP, spin-on or other suitable deposition technique.

Thermal insulation material, such as $SiO_2$, $Al_2O_3$, FSG, BPSG, AlN, GeN, GaN, SiON, SiN, porous oxide, low-k dielectric, xerogel, aerogel, $GeO_x$, $TiO_2$, TiON, $TaO_x$, ZnS—$SiO_2$, silica-based porous dielectric, polymer-based dielectric, silsesquioxane-based dielectric, or other suitable electrically isolating or semiconducting thermal insulation material different than first thermal insulation material layer 192a, is deposited over first thermal insulation material layer 192a to provide second thermal insulation material layer 192b. Second thermal insulation material layer 192b is deposited using CVD, ALD, MOCVD, PVD, JVP, spin-on, or other suitable deposition technique.

Likewise, thermal insulation material different than second thermal insulation material layer 192b is deposited over second thermal insulation material layer 192b to provide third thermal insulation material layer 192c. Thermal insulation material different than third thermal insulation material layer 192c is deposited over third thermal insulation material layer 192c to provide thermal insulation material layer 192d. In other embodiments, any suitable number of additional thermal insulation material layers 192 can be deposited over thermal insulation material layer 192d. In other embodiments, thermal insulation material layers 192c and 192d can be eliminated leaving only thermal insulation material layers 192a and 192b.

In one embodiment, first thermal insulation material layer 192a includes the same material as third thermal insulation material layer 192c, and second thermal insulation material layer 192b includes the same material as fourth thermal insulation material layer 192d. In one embodiment, thermal insulation material layers 192a and 192c include a porous oxide material, and thermal insulation material layers 192b and 192d include a nitride material, such as SiN. In other embodiments, other combinations of materials are possible.

A sacrificial layer of dielectric material, such as $SiO_2$, FSG, BPSG, or other suitable dielectric material or conducting material, is deposited over fourth thermal insulation material layer 192d to provide sacrificial material layer 132c. Sacrificial material layer 132c is deposited using CVD, ALD, MOCVD, PVD, JVP, spin-on, or other suitable deposition technique.

Figure 29:
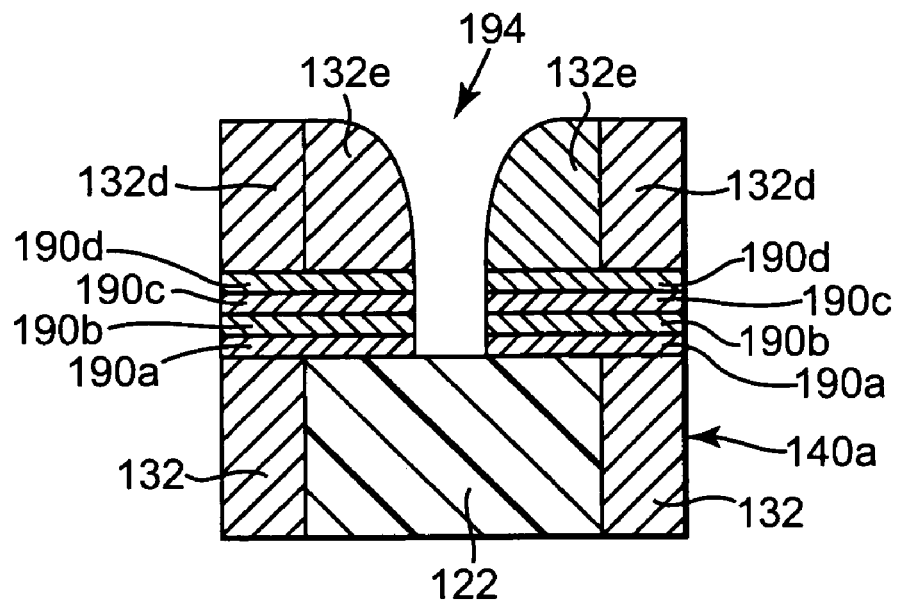
FIG. 29 illustrates a cross-sectional view of one embodiment of the preprocessed wafer, thermal insulation material layers, and sacrificial material layer after etching.

FIG. 29 illustrates a cross-sectional view of one embodiment of preprocessed wafer 140a, thermal insulation material layers 190a-190d, and sacrificial material layer 132d after etching sacrificial material layer 132c and thermal insulation material layers 192a-192d. A via opening 194 is etched into sacrificial material layer 132c to provide sacrificial material layer 132d. In one embodiment, an additional spacer layer is conformally deposited over via opening 194 and directionally etched back to provide sacrificial material layer 132e exposing a sublithographic portion of thermal insulation material layer 192d. The spacer layer includes a suitable dielectric material, semiconducting material, or metallic material. The exposed sublithographic portion of thermal insulation material layer 192d and the portions of thermal insulation material layers 192a-192c underneath the exposed portion of thermal insulation material layer 192d are etched to provide thermal insulation material layers 190a-190d.

Figure 30:
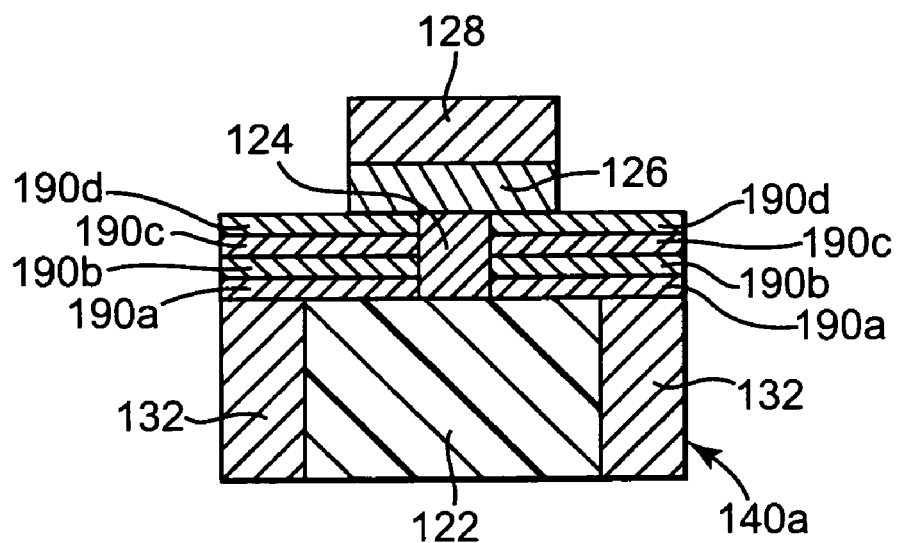
FIG. 30 illustrates a cross-sectional view of one embodiment of the preprocessed wafer, thermal insulation material layers, a first electrode, phase-change material, and a second electrode.

FIG. 30 illustrates a cross-sectional view of one embodiment of preprocessed wafer 140a, thermal insulation material layers 190a-190d, a first electrode or heater 124, phase-change material 126, and a second electrode 128. Dielectric material 132d is stripped. Heater or electrode material, such as TiN, TaN, W, Al, Cu, TiSiN, TaSiN, or other suitable heater or electrode material, is deposited in via 194 between thermal insulation material layers 190a-190d to provide first electrode or heater 124. First electrode or heater 124 is deposited using CVD, ALD, MOCVD, PVD, JVP, or other suitable deposition technique.

Phase-change material, such as a chalcogenic compound or other suitable phase-change material, is deposited over first electrode or heater 124 and thermal insulation material layer 190d to provide a phase-change material layer. The phase-change material layer is deposited using CVD, ALD, MOCVD, PVD, JVP, or other suitable deposition technique.

Electrode material, such as TiN, TaN, W, Al, Cu, TiSiN, TaSiN, or other suitable electrode material, is deposited over the phase-change material layer to provide a second electrode material layer. The second electrode material layer is deposited using CVD, ALD, MOCVD, PVD, JVP, or other suitable deposition technique. The second electrode material layer and the phase-change material layer are etched to provide phase-change material 126 and second electrode 128. Dielectric material, such as $SiO_2$, FSG, BPSG, low-k, or other suitable dielectric material, is deposited around second electrode 128 and phase-change material 126 to provide phase-change memory cell 120j as illustrated in FIG. 26.

Embodiments of the present invention provide a phase-change memory cell having multilayer thermal insulation. The multilayer thermal insulation offers improved memory cell insulation and uses typical CMOS materials that are easily integrated into the phase-change memory cell fabrication process. The multilayer thermal insulation structure provides increased insulation due to a low bulk thermal conductivity and significant interface resistance for selected material combinations. The multilayer thermal insulation allows lower reset power and reduced memory cell size.

What is claimed is:
1. A memory comprising:
a first electrode;
a second electrode;
phase-change material contacting the first electrode and the second electrode; and multilayer thermal insulation contacting the phase-change material, the multilayer thermal insulation comprising at least an electrically isolating layer and an electrically conducting layer,
wherein the first electrode is laterally completely enclosed by the multilayer thermal insulation and the phase-change material is laterally completely enclosed by a dielectric material.

2. The memory of claim 1, wherein the multilayer thermal insulation comprises at least three layers.

3. The memory of claim 1, wherein the multilayer thermal insulation comprises horizontal material layers.

4. The memory of claim 1, wherein the multilayer thermal insulation comprises vertical material layers.

5. The memory of claim 1, wherein the multilayer thermal insulation comprises a layer comprising one of $SiO_2$, $Al_2O_3$, AlN, GeSbTe, GeTe, GeN, GaN, GeSb, SiON, $GeO_x$, $TiO_2$, TiON, $TaO_x$, a low-k dielectric, xerogels, aerogels, ZnS—$SiO_2$, a silica-based based porous dielectric, a polymer-based dielectric, a silsesquioxane-based dielectric, and SiN.

6. The memory of claim 1, wherein the multilayer thermal insulation comprises a first layer having a first thermal conductivity and a second layer having a second thermal conductivity greater than the first thermal conductivity.

7. The memory of claim 1, further comprising:
dielectric material contacting the multilayer thermal insulation.

8. A memory comprising:
a first electrode;
a second electrode;
phase-change material between the first electrode and the second electrode; and
multilayer thermal insulation laterally surrounding the phase-change material, the multilayer thermal insulation comprising at least an electrically isolating layer and an electrically conducting layer, the multilayer thermal insulation contacting the first electrode and the second electrode.

9. The memory of claim 8, wherein the multilayer thermal insulation laterally surrounds the first electrode.

10. The memory of claim 8, wherein the multilayer thermal insulation laterally surrounds the first electrode and the second electrode.

11. The memory of claim 8, wherein a first layer of the multilayer thermal insulation has a first thermal conductivity and a second layer of the multilayer thermal insulation has a second thermal conductivity greater than the first thermal conductivity.

12. The memory of claim 11, wherein the second layer has a thickness less than approximately 15 nm.

13. The memory of claim 8, wherein the multilayer thermal insulation comprises at least three layers.

14. The memory of claim 8, further comprising:
a dielectric material contacting the multilayer thermal insulation.

15. A memory comprising:
a first electrode;
a second electrode;
phase-change material between the first electrode and the second electrode; and
means for thermally isolating an active region of the phase-change material using at least two standard complementary metal-oxide-semiconductor (CMOS) materials, the means for thermally isolating the active region contacting the first electrode and the second electrode,
wherein a first of the at least two complementary metal-oxide-semiconductor materials comprises an electrically isolating material, and a second of the at least two complementary metal-oxide-semiconductor materials comprises an electrically conducting material.

16. The memory of claim 15, wherein the first of the at least two complementary metal-oxide-semiconductor materials comprises a porous oxide, and the second of the at least two complementary metal-oxide-semiconductor materials comprises a nitride.

17. The memory of claim 15, wherein each of the at least two complementary metal-oxide-semiconductor materials comprise one of $SiO_2$, $Al_2O_3$, AlN, $GeO_x$, $TiO_2$, TiON, $TaO_x$, a low-k dielectric, porous $SiO_2$, GeN, SiON, and SiN.

18. The memory of claim 15, wherein the first of the at least two complementary metal-oxide-semiconductor materials has a first thermal conductivity, and the second of the at least two complementary metal-oxide-semiconductor materials has a second thermal conductivity greater than the first thermal conductivity.

19. A memory comprising:
a first electrode;
a second electrode;
phase-change material contacting the first electrode and the second electrode;
multilayer thermal insulation contacting the phase-change material, the first electrode, and the second electrode, the multilayer thermal insulation comprising at least three layers; and
dielectric material contacting the multilayer thermal insulation.

20. The memory of claim 19, wherein the multilayer thermal insulation comprises at least four layers.

21. The memory claim 19, wherein the phase-change material comprises a first portion laterally completely enclosed by the multilayer thermal insulation and a second portion laterally completely enclosed by the dielectric material.

22. The memory claim 19, wherein the multilayer thermal insulation comprises horizontal material layers.

23. The memory of claim 19, wherein the multilayer thermal insulation comprises vertical material layers.

24. The memory claim 19, wherein the multilayer thermal insulation comprises a layer comprising one of $SiO_2$, $Al_2O_3$, AlN, GeSbTe, GeTe, GeN, GaN, GeSb, SiON, $GeO_x$, $TiO_2$, TiON, $TaO_x$, a low-k dielectric, xerogels, aerogels, ZnS—$SiO_2$, a silica-based porous dielectric, a polymer-based dielectric, a silsesquioxane-based dielectric, and SiN.

25. The memory of claim 19, wherein the multilayer thermal insulation comprises a first layer having a first thermal conductivity and a second layer having a second thermal conductivity greater than the first thermal conductivity.

26. A memory comprising:
a first electrode;
a second electrode:
phase-change material contacting the first electrode and the second electrode;
multilayer thermal insulation contacting the phase-change material, the multilayer thermal insulation comprising at least three layers; and
dielectric material contacting the multilayer thermal insulation,
wherein the first electrode is laterally completely enclosed by the multilayer thermal insulation and the phase-change material is laterally completely enclosed by the dielectric material.

* * * * *